Jan. 5, 1960 K. E. APPERT ET AL 2,920,281

NOISE SUPPRESSOR

Filed April 27, 1954

INVENTORS
KURT E. APPERT
LENNART G. ERICKSON
BY Lippincott & Smith
ATTORNEYS 2,920,281
Patented Jan. 5, 1960

2,920,281

NOISE SUPPRESSOR

Kurt E. Appert, Atherton Heights, and Lennart G. Erickson, Hillsborough, Calif., assignors to Lenkurt Electric Co., Inc., San Carlos, Calif., a corporation of Delaware Application April 27, 1954, Serial No. 425,862

6 Claims. (Cl. 330—124)

This invention relates to an improvement in noise-reducing circuits and, more particularly, to circuits capable of improving average signal-to-noise ratio by cancelling noise in the absence of signal energy. The present application is a continuation-in-part of application Serial No. 241,683, filed August 13, 1951, now abandoned.

Particularly in telephonic systems, noise which is of low enough level to be completely masked when a signal is present becomes very disturbing in the intervals between syllables or words. The present invention provides a relatively simple yet highly effective circuit capable of the practical elimination of the foregoing objectionable disturbances occasioned by the presence of noise.

A pair of amplifiers is connected to form a parallel circuit having common input terminals, but with their respective output terminals so disposed as to produce opposition in the output energies thereof. One of the amplifiers is designed to have a constant-gain characteristic, whereas the other amplifier has a variable-gain characteristic. Automatic gain control means regulate the gain of the variable-gain amplifier in inverse relation to the input energy thereto. The frequency-response characteristics of the two amplifiers are substantially identical, and when the gain of the variable-gain amplifier is at its maximum value the gain of the two amplifiers is also substantially identical. Noise, as it appears in communication circuits may appear in any portion of the frequency band transmitted by the system, and in the most general case can be considered as having its energy distributed uniformly throughout the band. Because of the substantially identical characteristics of the two amplifiers under conditions of minimum signal (and hence maximum gain), and the opposition of the output circuits, the combined output level of the two amplifiers approaches zero. The presence of an actual signal, however, reduces the gain of the variable amplifier without affecting the gain of the other; and hence at normal signal levels, when the noise is masked, the presence of the variable-gain device is of no effect and the signal is transmitted at full designed gain, particularly where the automatic gain control is so designed as to reduce the gain of the amplifier on which it operates to unity or less. A high average signal-to-noise ratio is obtained from the combined outputs of the two amplifiers, because the signal energy is proportionately amplified more and attenuated less than the noise energy. Thus, it is apparent that objectionable noise energy is cancelled in the absence of signal energy, and the overall noise level is reduced.

Accordingly, it is an object of this invention to provide a simple, compact noise-reducing circuit which is operative at all times in the presence of signal energy but is substantially inoperative to transmit noise alone.

It is a further object of this invention to provide a circuit capable of noise elimination in short intervals, such as between syllables of a word.

A further object of this invention is the provision of a circuit capable of noise suppression automatically in accordance with the amount of noise energy present.

Other and further objects of the present invention will be apparent from the following detailed explanation, taken in conjunction with the accompanying drawings wherein.

Figure 1:
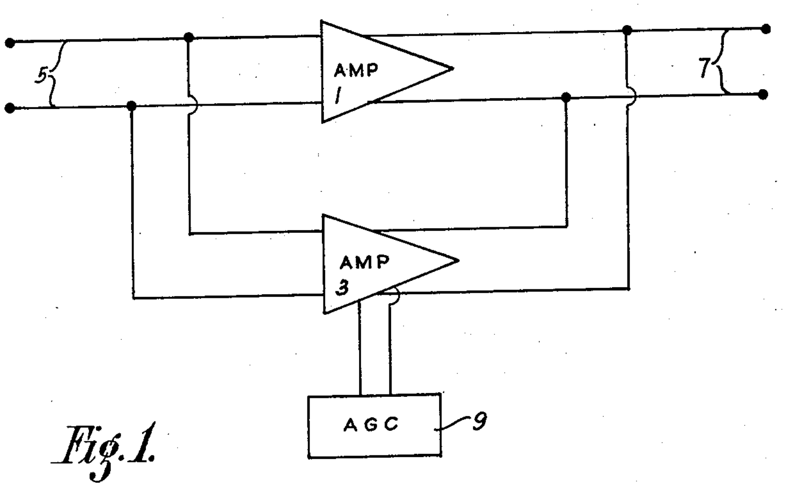
Fig. 1 is a block diagram of a preferred circuit arrangement for the present invention.

In Fig. 1, amplifiers 1 and 3 are connected to have common input terminals 5 and common output terminals 7. The output circuit of amplifier 3 is connected to the output circuit of amplifier 1 in such a manner as to provide opposition of the respective output energies of these amplifiers.

Amplifier 1 is designed to have a constant-gain characteristic, whereas automatic gain control means 9 is provided to adjust the gain of amplifier 3 in inverse relation with the input energy level. By combining the characteristics of amplifiers 1 and 3 in a subtractive manner, an over-all output characteristic is obtained substantially as shown in Fig. 3.

Figure 3:
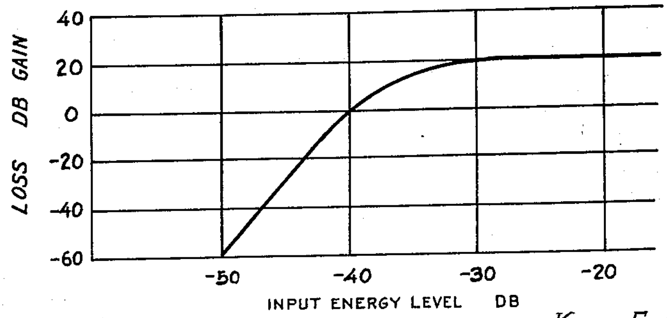
Fig. 3 is a curve indicative of the combined output characteristics of the amplifiers employed in the present invention.

The abscissa for the curve of Fig. 3 is measured in decibels of input energy below a zero reference level, and the ordinate indicates over-all gain or loss, also in decibels. Zero reference level for the present invention is established at 1 milliwatt of power through 600 ohms of resistance.

To simplify explanation of the present invention, but not to be taken as a limitation thereof, values will be assumed for input signal and noise levels, and operation of the circuit of Fig. 1 will be described, reference being had to the curve of Fig. 3.

If the input signal level at terminals 5 is 20 db below reference level and the input noise level is 50 db below the reference level, the output of amplifier 1 will be 0 db for signal level and —30 db for noise level, assuming that the constant-gain level of amplifier 1 is established at 20 db. Expressed in milliwatts of power, the signal output is 1 milliwatt and the noise output is .001 milliwatt. Also, a —20 db signal level and a —50 db noise level, or a total of .00101 milliwatts of power will be present at the input of amplifier 3 to influence automatic gain control 9 and cause the gain of amplifier 3 to be unity, or less than unity if desired. Accordingly, for the condition of —20 db signal level, or .01 milliwatts, and —50 db noise level, or .00001 milliwatts at common input terminals 5, the combined output at terminals 7 is .99 milliwatts of signal and .00099 milliwatts of noise. As the input signal-to-noise ratio is 1,000:1, and as the output signal-to-noise ratio is 1,000:1, no instantaneous signal-to-noise ratio increase is obtained.

However, when no signal is present at the input terminals 5, but the noise level remains at —50 db, the automatic gain control circuit 9 adjusts the gain of amplifier 3 to be equal to the gain of amplifier 1, i.e., 20 db. Thus, in the output circuit 7, noise is substantially completely cancelled and hence the listener, for example, of a telephone conversation, hears nothing between syllables, words and during other pauses. Accordingly, if signal-to-noise ratio is measured for an entire conversation, it is readily apparent that the present invention provides a greatly increased average value for the ratio.

The curve of Fig. 3 is drawn to show conditions which have generally been found to be desirable in telephone circuits, but it is to be understood that to meet specific conditions the circuit parameters can be varied through a considerable range. The principal variation will be in the sensitivity of the automatic gain control, which will vary the slope of the initial portion of the curve, the level at which the automatic control begins to take effect, or both. Automatic gain control design is well understood and it therefore appears unnecessary to do more than point out that the input-level vs. gain characteristics may be varied to meet the needs of a specific design. Both the curve of Fig. 3 and the specific values given immediately above are merely to be considered as typical of what can be done to meet a given set of performance requirements.

Of course the present invention is equally applicable to communications in general, with specifically desirable application to radio and television. Thus, it is desired that this invention not be limited to telephonic circuits as herein described.

Figure 2:
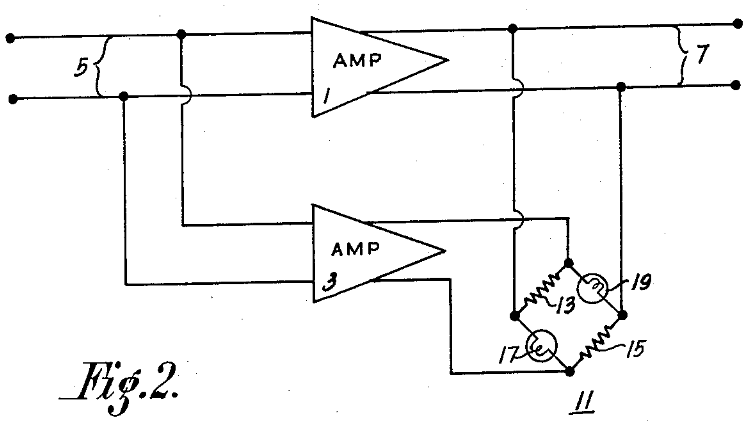
Fig. 2 is similar to the arrangement of Fig. 1, but showing a different form of gain control.

In Fig. 2, a vario-losser circuit 11 is employed to replace automatic gain control means 9. In this circuit, two substantially equal impedances 13 and 15 are disposed to define opposite arms of a bridge circuit with tungsten or other suitable filaments 17 and 19, or lamps forming the other two arms. The output circuit of amplifier 3 is connected across one diagonal of the bridge and the common output circuit 7 is connected across the other diagonal.

As the hot resistance of tungsten is about four times its cold resistance, a high degree of attenuation is applied to the output energy of amplifier 3 when both noise and signal energy are present. However, when the signal is off, the vario-losser 11 allows the noise level through amplifier 3 to reach terminals 7 at substantially the level of the noise passed by amplifier 1, to effect a cancellation thereof. Other suitable vario-losser circuits may be employed in place of circuit 11. For example, the use of thermistor resistors in place of the tungsten filaments 17 and 19 might be desirable to increase the range of attenuation of circuit 11.

In the foregoing numerical examples, it may be desirable to include an attenuator pad of perhaps 10 db in series with amplifier 3, in which case the gain of amplifier 3 would be variable over a 10–30 db range. This would allow the path through amplifier 3 to have a maximum gain of 20 db, which is equal to the constant gain of amplifier 1.

It should be obvious that both the constant-gain and the variable-gain branches of the circuit should have substantially similar pass-bands if the device is to produce its desired effect. In a telephone circuit the gain of the constant-gain circuit will normally be substantially uniform over the entire pass-band of the channel or channels with which the device is associated, and in this case the gain characteristic of the variable-gain branch should preferably be equally flat over the same pass-band. If, at maximum gain, the variable circuit has a higher gain than the fixed-gain circuit it will introduce noise into the output merely reversed in phase.

Nevertheless it is not essential that the correspondence between the two circuits in either frequency band or maximum gain, be absolute. Thus if, at maximum gain the amplifier 1 has a voltage amplification of 10, corresponding to 20 db gain, and the circuit including amplifier 3 has an over-all amplification of either 9 or 11, the noise in the output circuit 7 will be reduced to $\frac{1}{10}$ its amplitude in the absence of the variable-gain circuit, or by 20 db. In many instances this reduction will be ample for all practical purposes. Therefore, although the closer the maximum-gain characteristics of the branch containing amplifier 3 approach the characteristics of amplifier 1 the better the over-all performance will be an approximate or "substantial" correspondence between the two amplifier circuits is still within the scope of the invention.

We claim:

1. A noise-reducing circuit comprising a pair of amplifiers each having input and output terminals, said input terminals being connected to receive the same input signals and said amplifiers being responsive to substantially the same frequencies, said output terminals being respectively connected to produce opposition between the individual amplifier outputs, one of said amplifiers having a substantially constant gain characteristic, and automatic gain control means connected to the other of said amplifiers to vary the gain thereof with respect to all frequencies supplied thereto in inverse relation to the input energy level thereto from less than unity to the substantially constant gain level of said one of said amplifiers.

2. A noise-reducing circuit capable of increasing average signal-to-noise ratios throughout a range of input energy levels comprising a pair of amplifiers having substantially similar pass-bands connected in parallel to have respectively opposing outputs, one of said amplifiers having a substantially constant energy gain throughout said input range, automatic gain control means connected to the other of said amplifiers for varying the energy gain therein inversely with input energy level from a gain of less than unity to a gain equal to that of said one of said amplifiers whereby average signal-to-noise ratio is increased and noise is substantially cancelled when no signal is present.

3. A noise-reducing circuit comprising a pair of amplifiers having substantially similar pass-bands connected in parallel to have respectively opposing outputs, one of said amplifiers having a constant-gain characteristic, automatic gain control means connected to the other of said amplifiers to adjust the gain thereof inversely with the input energy level thereto, said means being responsive to a small amount of noise energy to adjust the gain of said other amplifier to equal the gain of said one of said amplifiers and said means being responsive to a large amount of signal and noise energy to adjust said gain of said other amplifier to approximately unity.

4. A noise reducing circuit comprising a first and a second amplifier connected in parallel but having opposing outputs, both of said amplifiers being responsive to substantially the same frequencies, said first amplifier having a substantially constant gain throughout the entire range of input energy to said noise reducing circuit, and automatic gain control means associated with said second amplifier to vary the gain thereof inversely with respect to the level of said input energy thereby to eliminate unmasked low amplitude noise without interfering with the transmission of intelligence signals through said first amplifier.

5. In an electrical communication circuit transmitting electric signals occupying a band of frequencies and noise in the same band of frequencies, the noise reducing combination of two circuit branches in parallel, each transmitting said signals and said noise throughout said band of frequencies with a phase inversion relative to the same signal and noise transmitted by the other circuit branch, one of said branches having a constant gain amplifier and the other of said branches having a variable gain amplifier, the gain of said constant gain amplifier and the gain of said variable gain amplifier being substantially equal to each other throughout said band of frequencies in substantial absence of said signals, and automatic means comprising automatic gain control apparatus associated with said variable gain amplifier for providing a multifold reduction in the gain of said variable gain amplifier as the power level of said signals increases, whereby said signals are transmitted with a net gain approaching the gain of said constant gain amplifier and said noise is substantially cancelled out during intervals when said signals are absent.

6. In an electrical communication circuit transmitting electric signals occupying a band of frequencies and noise in the same band of frequencies, the noise reducing combination of two circuit branches in parallel, each transmitting said signals and said noise throughout said band of frequencies with a phase inversion relative to the same signals and noise transmitted by the other circuit branch, one of said branches having a constant transmission gain and the other of said branches having a variable transmission gain, said constant transmission gain and said variable transmission gain being substantially equal to each other throughout said band of frequencies in the substantial absence of said signals, and automatic means for providing a multifold reduction in said variable transmission gain as the power level of said signals increases, whereby said signals are transmitted with a net gain approaching the gain of said constant transmission gain and said noise is substantially cancelled out during intervals when said signals are absent, and said automatic means comprising an attenuator characterized by a transmission loss that varies as a direct function of the input signal power level.

References Cited in the file of this patent

UNITED STATES PATENTS

| | | |
|---|---|---|
| 1,481,284 | Deardorff | Jan. 22, 1924 |
| 1,689,318 | Bjornson | Oct. 30, 1928 |
| 1,901,929 | Peterson | Mar. 21, 1933 |
| 2,438,217 | Johnson | Mar. 23, 1948 |
| 2,621,253 | Meers | Dec. 2, 1952 |
| 2,622,150 | Coulter et al. | Dec. 16, 1952 |
| 2,737,628 | Haines | Mar. 6, 1956 |